US008263193B2

(12) United States Patent
Miyahara et al.

(10) Patent No.: US 8,263,193 B2
(45) Date of Patent: Sep. 11, 2012

(54) VACUUM TREATMENT METHOD

(75) Inventors: Hiroomi Miyahara, Nagasaki (JP); Tatsuyuki Nishimiya, Nagasaki (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 619 days.

(21) Appl. No.: 12/311,184

(22) PCT Filed: Jan. 30, 2008

(86) PCT No.: PCT/JP2008/051445
§ 371 (c)(1),
(2), (4) Date: Mar. 20, 2009

(87) PCT Pub. No.: WO2008/102622
PCT Pub. Date: Aug. 28, 2008

(65) Prior Publication Data
US 2010/0068411 A1     Mar. 18, 2010

(30) Foreign Application Priority Data
Feb. 23, 2007   (JP) ................... 2007-043270

(51) Int. Cl.
*C23C 16/00* (2006.01)
*C23C 16/50* (2006.01)

(52) U.S. Cl. ............. 427/574; 427/569; 118/723 E

(58) Field of Classification Search .......... None
See application file for complete search history.

(56) References Cited

U.S. PATENT DOCUMENTS

| 2001/0009141 A1* | 7/2001 | Kong et al. ............ 118/728 |
| 2001/0017190 A1* | 8/2001 | Nakaune et al. ....... 156/345 |
| 2002/0007785 A1* | 1/2002 | Gujer et al. ............ 118/500 |
| 2004/0077113 A1* | 4/2004 | Yamazaki et al. ...... 438/29 |
| 2005/0067934 A1* | 3/2005 | Ueda et al. ............. 313/231.31 |
| 2006/0269690 A1 | 11/2006 | Watanabe et al. |

FOREIGN PATENT DOCUMENTS

| JP | H06-283435 | 10/1994 |
| JP | H07-201847 | 8/1995 |
| JP | H07-230960 | 8/1995 |

(Continued)

OTHER PUBLICATIONS

Definition of Rod, Merriam Webster online dictionary.*

(Continued)

*Primary Examiner* — Timothy Meeks
*Assistant Examiner* — Joseph Miller, Jr.
(74) *Attorney, Agent, or Firm* — Manabu Kanesaka; Kenneth M. Berner; Benjamin J. Hauptman

(57) ABSTRACT

A vacuum treatment method and a vacuum treatment apparatus are provided in which the $SiH_2/SiH$ ratio does not increase even when the deposition rate is increased, thereby deterioration in the film quality is prevented and a high level of productivity can be achieved. A vacuum treatment method comprising the steps of heating a substrate (8) disposed inside a deposition chamber (6) under a reduced pressure atmosphere using a heat spreader (a heating device) (5), and supplying electric power to a discharge electrode (3) disposed in a position facing the substrate (8), thereby conducting a deposition on the substrate (8), wherein the deposition is conducted in a state where the temperature difference between the substrate (8) and the discharge electrode (3) is not more than 30° C. The deposition may also be conducted with the gap between the substrate (8) and the discharge electrode (3) set to not more than 7.5 mm.

7 Claims, 6 Drawing Sheets

FOREIGN PATENT DOCUMENTS

| | | |
|---|---|---|
| JP | H07-254590 | 10/1995 |
| JP | H09-148322 | 6/1997 |
| JP | 2004-266111 | 9/2004 |
| JP | 2006-278777 | 10/2006 |
| JP | 2007-115757 | 5/2007 |

OTHER PUBLICATIONS

Damir Kujundzic et atl, "Particle Growth in Silane-Hydrogen Discharges" Journal of Applied Physics, American Institute of Physics, New York, US LNKD-DOI: 10.1063/1.2168230, vol. 99, No. 3, Feb. 3, 2006.

M. A. Childs et al, "Plasma Charge-Density Rations in a Dusty Plasma", Journal of Applied Physics, New York, US LNKD-DOI: 10.1063/1. 371983, vol. 87, No. 3, Feb. 1, 2000, pp. 1086 to 1090.

M. A. Childs et al, "Small Particle Growth in Silane Radio-Frequency Discharges", Journal of Applied Physics, American Institute of Physics., New York, US LNKD-DOI: 10.1063/1.371982, vol. 87, No. 3, Feb. 1, 2000, pp. 1076-1085.

* cited by examiner ously, improving the film quality and improving the deposition rate exist in a trade-off relationship, and achieving improvements in both the film quality and the deposition rate would be highly desirable.

VACUUM TREATMENT METHOD

TECHNICAL FIELD

The present invention relates to a vacuum treatment method particularly to a vacuum treatment method in which treatment of a substrate is conducted using a plasma.

BACKGROUND ART

Plasma CVD devices are known examples of vacuum treatment apparatuses in which a semiconductor is gasified using a plasma, and a thin film of the semiconductor is then formed on a heated substrate. Solar cells in which a silicon-based thin film deposited on the surface of a glass substrate comprises laminated p-layer, i-layer and n-layer, and light irradiated onto the i-layer is converted to electrical power are also known.

Patent Citation 1: Japanese Unexamined Patent Application, Publication No. Hei 6-283435
Patent Citation 2: Japanese Unexamined Patent Application, Publication No. Hei 7-230960

DISCLOSURE OF INVENTION

In recent years, demands have grown for reductions in the production costs of solar cells. As a result, a deposition rate within the aforementioned vacuum treatment apparatus for the i-layer that functions as a photovoltaic layer must be increased. However, if this deposition rate is increased, then a $SiH_2/SiH$ ratio, which indicates the state of silicon-hydrogen bonding within an amorphous silicon film, also increases. The $SiH_2/SiH$ ratio is used as an indicator of film quality. An increase in the $SiH_2/SiH$ ratio indicates a reduction in the quantity of Si—Si bonds and an increase in the number of defects after light soaking, meaning a deterioration in the film quality.

It is known that raising the substrate temperature can be used to suppress the increase in the $SiH_2/SiH$ ratio that occurs when the deposition rate is increased. This reduces the $SiH_2/SiH$ ratio and improves the film quality. However, in the case of deposition of the i-layer of the amorphous silicon solar cell, problems arise in that considerable time is needed for the substrate temperature to stabilize because the quantity of heat flowing in and out of the substrate increases as the deposition temperature (the substrate temperature) is raised, and in that fluctuations in the temperature may cause a deterioration in the performance of the solar cell. Furthermore, if the substrate temperature is raised, then the band gap for the i-layer may deviate from the appropriate range, and the boron that acts as the dopant within the underlying p-layer may diffuse, causing a reduction in the open-circuit voltage and deterioration in the performance of the cell.

Accordingly, improving the film quality and improving the deposition rate exist in a trade-off relationship, and achieving improvements in both the film quality and the deposition rate would be highly desirable.

The present invention has an object of providing a vacuum treatment method and a vacuum treatment apparatus, in which the $SiH_2/SiH$ ratio does not increase even when the deposition rate is increased, and in which deterioration in the film quality is prevented and a high level of productivity can be achieved.

A vacuum treatment method of the present invention is a method comprising the steps of heating a substrate disposed inside a deposition chamber under a reduced pressure atmosphere using a heating device, supplying a raw material gas to the deposition chamber, and supplying electric power to a discharge electrode disposed in a position facing the substrate, thereby conducting a deposition on the substrate, wherein the deposition is conducted in a state in which the temperature difference between the substrate and the discharge electrode is not more than 30° C.

In the vacuum treatment method of the present invention, because the temperature difference between the substrate and the discharge electrode is small, the quantity of heat flowing in and out of the substrate is reduced, and fluctuations in the substrate temperature during the production process for a photovoltaic device (such as a solar cell) are also reduced. Therefore, the process window for selection of the deposition conditions is broad, thus enabling the conditions to be set within reliable ranges. As a result, restrictions on the deposition conditions can be relaxed, and performance stability improves. In a particularly preferred configuration, if the aforementioned temperature difference between the substrate and the discharge electrode is reduced to approximately 20° C., then the degree of robustness can be further improved.

In the vacuum treatment method of the present invention, deposition is preferably conducted with the gap between the substrate and the discharge electrode set to a value of not less than 4.5 mm and not more than 7.5 mm.

This improves the thermal conductivity between the substrate and the discharge electrode, and therefore ensures that the temperature difference between the substrate and the discharge electrode does not widen. As a result, even if the substrate temperature during high-speed deposition is set to a comparatively low temperature of 200° C. or lower, the $SiH_2/SiH$ ratio, which correlates with the level of light-induced-degradation, can be suppressed to a low level, enabling an improvement in the quality of the produced film.

A vacuum treatment apparatus of the present invention is a apparatus comprising a chamber that forms a deposition chamber under a reduced pressure atmosphere, a heating device for heating a substrate disposed inside the chamber, a supply device for supplying a raw material gas into the deposition chamber, a discharge electrode that is disposed in a position facing the substrate, and a heating medium passage for regulating a temperature of the discharge electrode, in which deposition on the substrate is conducted by supplying electric power to the discharge electrode, wherein the vacuum treatment apparatus further comprises mechanisms for regulating a temperature difference between the substrate and the discharge electrode, and a deposition pressure.

With the vacuum treatment apparatus of the present invention, in those environments where the discharge electrode is prone to temperature increases as a result of the plasma generation at the discharge electrode during deposition, the temperature of the discharge electrode can be regulated. As the result, the temperature difference between the substrate and the discharge electrode can be set to a value that is suitable for deposition, thereby enabling the deposition pressure to be set to a level that provides a stable plasma. For example, if a control unit is provided that controls the deposition such that the temperature difference between the substrate and the discharge electrode is not more than 30° C., and the vacuum treatment is then conducted under the control of this control unit, then if the gap between the substrate and the discharge electrode is set to a value of not less than 4.5 mm and not more than 7.5 mm, and the deposition pressure is set to a value of not less than 150 Pa and not more than 500 Pa, the effects of temperature fluctuation during the production process for a photovoltaic device are minimal, and the plasma adopts a stable state, thereby restrictions on the deposition conditions can be relaxed, enabling an improvement in the performance stability. Furthermore, by setting the deposition pressure to a relatively high value, the deposition rate can be increased, which is particularly desirable.

In the vacuum treatment apparatus of the present invention, the heating medium passage may be provided inside the discharge electrode.

The discharge electrode may be a plurality of substantially parallel electrodes that extend in a substantially parallel arrangement relative to the surface of the substrate on which deposition is to be conducted. A channel may be formed in each discharge electrode, in the surface that faces the substrate surface, with this channel extending along the lengthwise direction of the discharge electrode. In other words, the cross-sectional shape of each discharge electrode, in a direction perpendicular to the lengthwise direction, is a U-shape that is open on the substrate-side of the electrode, comprising a base portion that is parallel to the substrate surface, and side portions that extend towards the substrate from either side of the base portion. A raw material gas passage may be provided within the interior of the base portion, and the raw material gas is emitted substantially uniformly from a multitude of small apertures provided within the base portion of the U-shape, thereby lengthening the distance in which the raw material gas travels before reaching the substrate, and enabling uniform supply of the raw material gas. The aforementioned heating medium passage can be provided inside the two side portions of each of the discharge electrodes. In other words, the discharge electrode acts as a holder for holding the heating medium passage. Because this improves the thermal conductivity between the discharge electrode and the heating medium, control of the discharge electrode temperature is excellent. Furthermore, in order to ensure a more uniform flow rate distribution for the raw material gas, a perforated plate may be provided on the substrate-side raw material emission portion within the open portion of the base portion of each of the discharge electrodes with a U-shaped cross-section.

In the vacuum treatment apparatus of the present invention, the discharge electrode is preferably positioned so that the gap between the discharge electrode and the substrate is not less than 4.5 mm and not more than 7.5 mm.

This improves the thermal conductivity between the substrate and the discharge electrode, prevents the temperature difference from widening. As a result, the degradation rate can be suppressed even at comparatively low substrate temperature and the deposition quality to be improved, even if the deposition rate is raised.

According to the present invention, because the film quality is stable even at comparatively low temperatures, the deposition rate can be increased while the light-induced-degradation rate of the layers of the photovoltaic device is reduced, thereby a high level of productivity can be obtained. Moreover, because the deposition temperature need be raised no higher than necessary, an improvement in the performance of the photovoltaic device arising from an increase in the open-circuit voltage can also be achieved.

EXPLANATION OF REFERENCE

Figure 1:
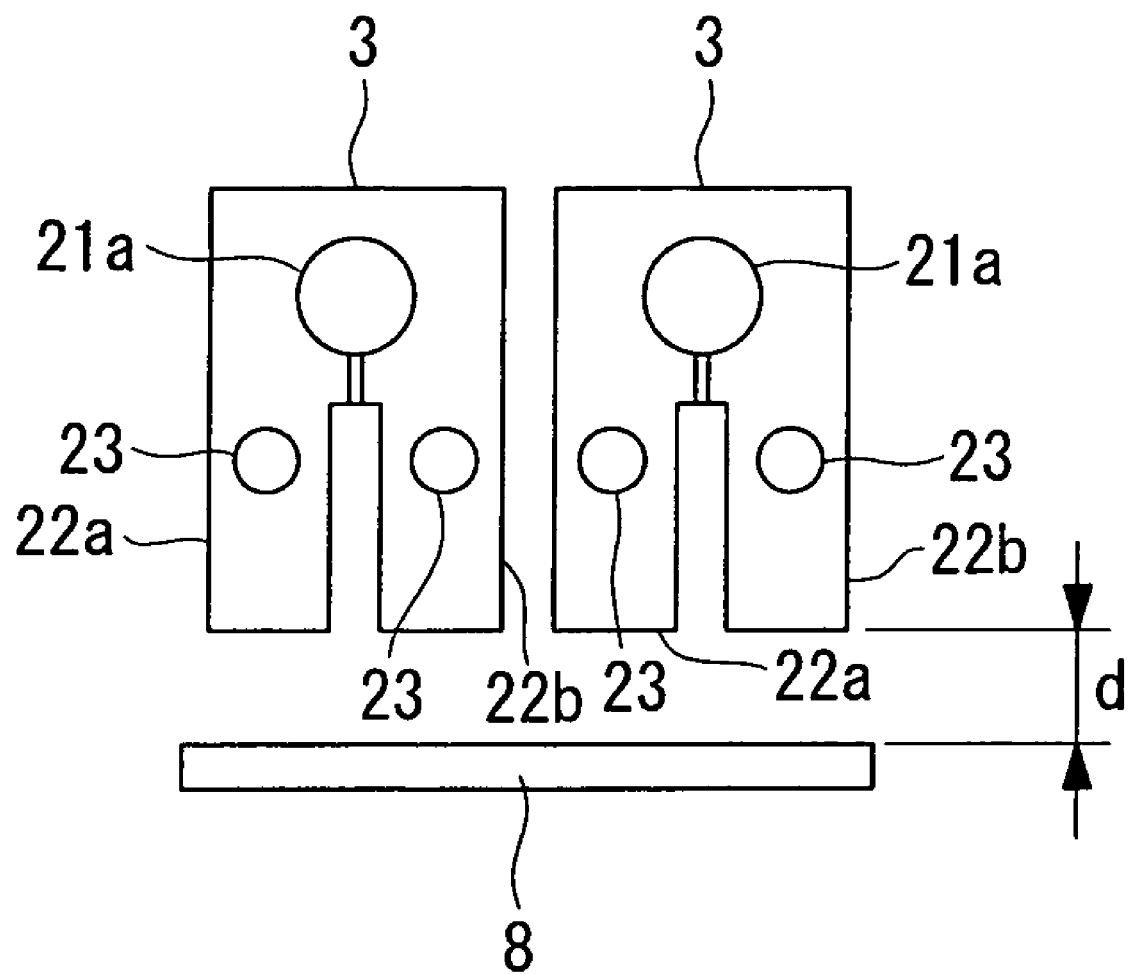
FIG. 1 An enlarged view showing a discharge electrode used in a thin-film production apparatus according to an embodiment of the present invention.

1: Thin-film production apparatus
2: Counter electrode
3: Discharge electrode
3a: Discharge electrode
5: Heat spreader (heating device)
8: Substrate
22a, 22b: Side portion
23: Heating medium passage
100: Control unit

BEST MODE FOR CARRYING OUT THE INVENTION

Figure 2:
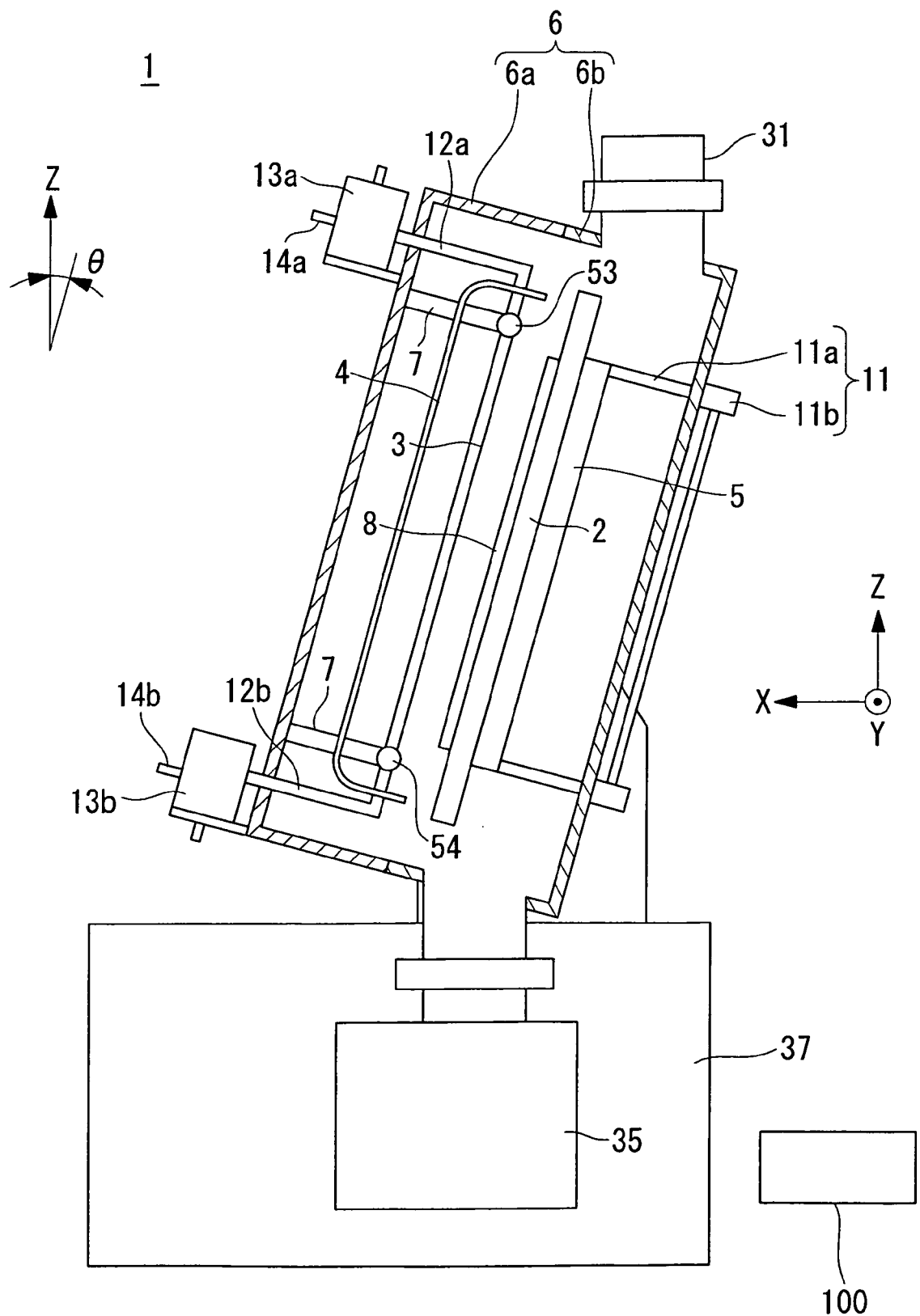
FIG. 2 A schematic illustration showing the structure of a thin-film production apparatus according to the present invention, viewed from the side of the thin-film production apparatus.
Figure 3:
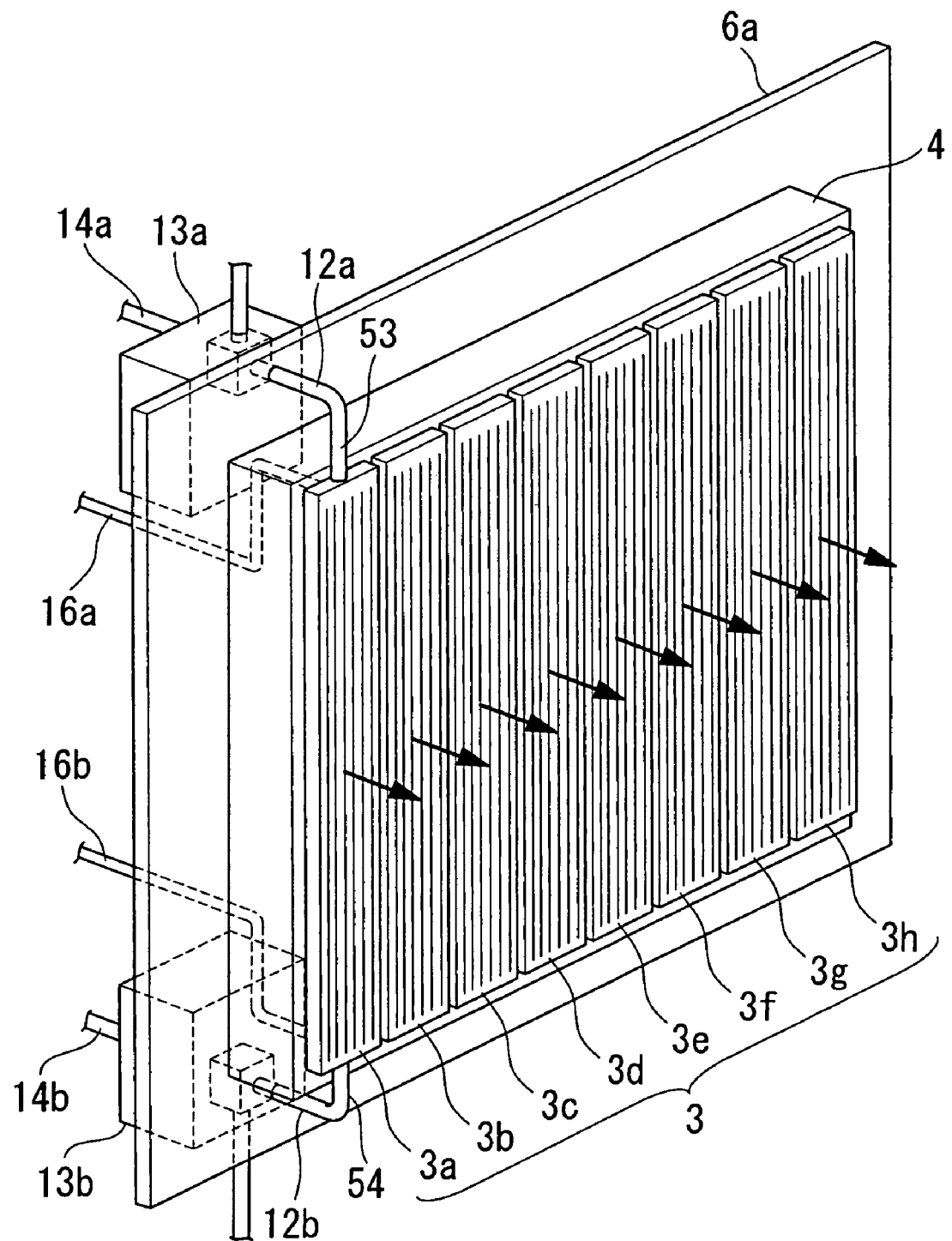
FIG. 3 A partial perspective view showing a portion of the structure of the same thin-film production apparatus.

An embodiment of a thin-film production apparatus (a vacuum treatment apparatus) that is capable of conducting high-speed deposition is described below. FIG. 1 is a diagram showing a discharge electrode used in the thin-film production apparatus according to this embodiment, and FIG. 2 is a schematic illustration showing the structure of the thin-film production apparatus, viewed from the side of the thin-film production apparatus 1. FIG. 3 is a partial perspective view showing a portion of the structure of the thin-film production apparatus.

As shown in FIG. 2, the thin-film production apparatus 1 comprises a deposition chamber (the chamber) 6, a counter electrode 2, a heat spreader 5, a heat spreader holding mechanism 11, a discharge electrode 3, a deposition preventing plate 4, a support 7, a high-frequency power feeding transmission path 12, a matching unit 13, a high-vacuum evacuation unit 31, a low-vacuum evacuation unit 35, a base 37, and a control unit 100 that controls the entire apparatus. In the figure, structures relating to the gas supply are omitted. The thin-film production apparatus 1 is used, for example, for producing solar cells such as single-layer amorphous silicon solar cells.

The deposition chamber 6 is a vacuum container, and inside the container, an amorphous silicone i-layer or the like is deposited on a substrate 8. The deposition chamber 6 is supported on top of the base 37 with an inclination from the z direction (the vertical direction) of θ=7° to 12°. As a result, the deposition treatment surface of the substrate 8 on the counter electrode 2 is tilted upwards by 7° to 12° relative to the z direction. Inclining the substrate 8 slightly from the vertical is preferred as it suppresses any increase in the installation space required for the apparatus while enabling the substrate 8 to be supported with minimal effort by using the weight of the substrate 8 itself, and also improves the contact between the substrate 8 and the counter electrode 2, thereby improving the uniformity of the temperature distribution and the electrical potential distribution across the substrate 8.

The counter electrode 2 is a conductive plate formed from a non-magnetic material that includes a holding device (not shown in the figure) that can hold the substrate 8. In those cases where self-cleaning is to be conducted, the use of a nickel alloy, aluminum or an aluminum alloy is preferred in terms of providing resistance to fluorine radicals. The counter electrode 2 is the opposing electrode to the discharge electrode 3 (for example, on the grounding side). One surface of the counter electrode 2 is positioned in close contact with the heat spreader 5, and during deposition, the other surface closely contacts the surface of the substrate 8. The temperature of the heat spreader 5 (the heating device) is controlled, either by circulating, within the inside of the heat spreader, a heating medium for which the temperature has been controlled, or by incorporating a temperature-controlled heater within the heat spreader, and therefore the heat spreader has a substantially uniform temperature across the heat spreader, and also performs the role of uniforming the temperature of the counter electrode 2 that contacts the heat spreader.

The heating medium is a non-conductive medium, examples of which include highly thermally conductive gases such as hydrogen or helium, fluorine-based inert liquids, inert oils, and pure water. Of these, in terms of preventing the pressure from rising within a temperature range from 150° C. to 250° C., and facilitating control, the use of a fluorine-based inert liquid (for example, a commercial product such as Galden or F05) is preferred.

The heat spreader holding mechanism 11 holds the heat spreader 5 and the counter electrode 2 in a substantially parallel arrangement relative to the side surface of the deposition chamber 6 (the right side in FIG. 2). During deposition, the heat spreader 5, the counter electrode 2 and the substrate 8 are moved closer to the discharge electrode 3. This enables the distance d between the substrate 8 and the discharge electrode 3 to be set to approximately 7.5 mm or less, as described below.

The discharge electrode 3 may be structured such that a series of rod-shaped longitudinal electrodes are combined in a substantially parallel arrangement, and the electrode may also be divided into a plurality of electrode units. In those cases where the discharge electrode 3 has a divided structure, the divisions are preferably formed to coincide with the number of feeding points. High-frequency electric power is supplied via the feeding points 53, 54 that connect the high-frequency power feeding transmission path 12a, 12b, thereby generating a plasma of the raw material gas between the discharge electrode 3 and the counter electrode 2, and generating a film on the substrate 8. The deposition preventing plate 4 is grounded, and restricts the region across which the plasma can expand, thereby restricting the deposition region. The support 7 holds the discharge electrode 3 in an insulated manner, so that the discharge electrode is aligned substantially parallel to the deposition preventing plate 4 and the side surface of the deposition chamber 6 (the left side in FIG. 2).

The matching unit 13 (13a and 13b) matches the output-side impedance, and enables the high-frequency electric power to be transmitted from a high-frequency power source that is not shown in the figure, through a high-frequency power feeding transmission path 14 (14a and 14b) and the high-frequency power feeding transmission path 12, and into the discharge electrode 3.

FIG. 3 is a partial perspective view showing a portion of the structure of the thin-film production apparatus 1. In this embodiment, the discharge electrode 3 comprises, for example, 8 discharge electrodes 3a to 3h.

Raw material gas is supplied to each of the discharge electrodes 3a to 3h from raw material gas pipes 16a and 16b that are connected near the feeding point 53 and the feeding point 54 respectively. This raw material gas is emitted substantially uniformly in the direction shown by the arrows in the figure (towards the counter electrode).

However, electric power supply to the discharge electrodes 3a to 3h can also be conducted using more than 8, or fewer than 8 combinations of the matching units 13a and 13b, and the high-frequency power feeding transmission paths 14a and 14b. Furthermore, electric power may also be supplied from individual high-frequency power source units. In these cases, the number of groupings of the discharge electrodes 3a to 3h is preferably increased or decreased to match the number of the above combinations.

FIG. 1 shows an enlarged view of the discharge electrode 3. The plurality of discharge electrodes 3 extend in a direction substantially parallel to the surface of the substrate 8 that is to undergo deposition (namely, in the depth direction from the paper surface), and are positioned in a substantially parallel arrangement relative to each other. A channel is formed in the surface of each discharge electrode 3 facing the surface of the aforementioned substrate 8, and the channel extends along the extending direction of the discharge electrode. In other words, the cross-sectional shape of each discharge electrode 3 in a direction perpendicular to the extending direction is a U-shape that is open on the surface of the electrode facing the substrate 8, comprising a base portion that is parallel to the substrate surface, and side portions 22a and 22b that extend towards the substrate 8 from either side of the base portion. A gas passage 21a through which the raw material gas flows is provided within the interior of the base portion, and an aforementioned heating medium passage 23 is provided within each of the two side portions 22a and 22b. The heating medium is supplied to the heating medium passage 23 using a heating medium supply device that is not shown in the figure, and temperature control is achieved by controlling the flow rate of the heating medium using the control unit 100. The heating medium can use the same types of media as the media described above for use within the heat spreader 5.

The distance between the substrate 8 and the edges of the two side portions 22a and 22b of the discharge electrode 3 that are closest to the substrate is typically not less than 3 mm and not more than 10 mm, and is preferably not less than 4.5 mm and not more than 7.5 mm. In conventional apparatus, the distance between the discharge electrode and the substrate has typically been within a range from approximately 20 mm to approximately 40 mm, but in this embodiment, the distance (gap) d between the substrate 8 and the edges of the two side portions 22a and 22b of the discharge electrode 3 that are closest to the substrate is a narrow gap.

A film production method (vacuum treatment method) that uses a thin-film production apparatus with the above configuration is described below.

The substrate 8 disposed inside the deposition chamber 6 under a reduced pressure atmosphere is heated using the heat spreader 5, and high-frequency electric power is supplied via the feeding points 53, 54 that connect the high-frequency power feeding transmission path 12a, 12b, thereby generating a plasma of the raw material gas between the discharge electrode 3 and the counter electrode 2, and depositing a film on the substrate 8.

During this process, the quantity of the heating medium flowing through the heating medium passage 23 is controlled by the control unit 100, so that the difference between the temperature of the discharge electrode 3 and the temperature of the substrate is not more than 30° C., and is preferably approximately 20° C. Furthermore, the pressure within the deposition chamber 6 during the process is preferably set to a value of not less than 150 Pa and not more than 500 Pa.

Figure 4:
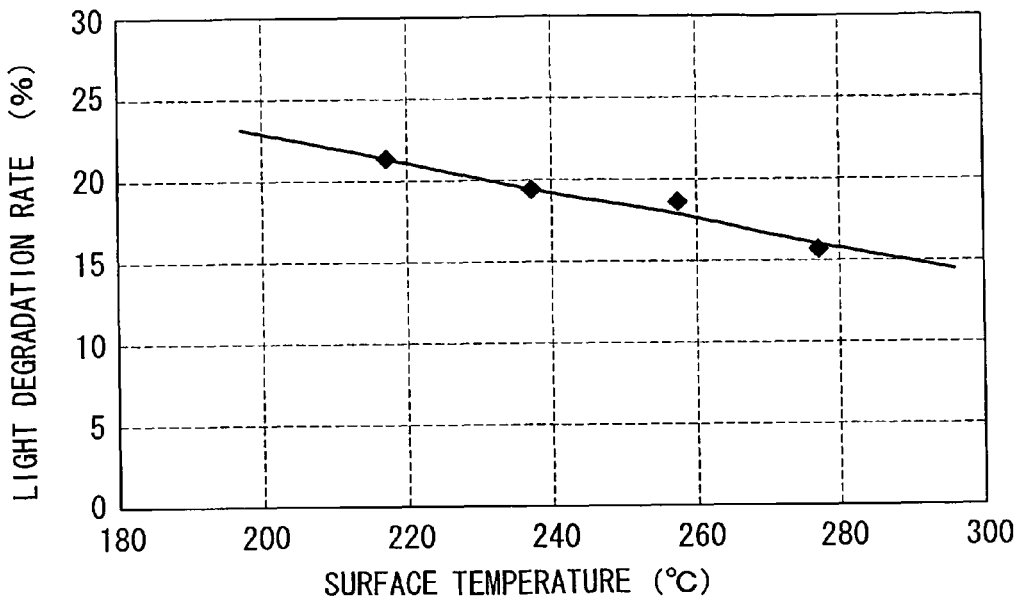
FIG. 4 A graph showing the temperature dependency of the light-induced-degradation rate of a film.

In conventional thin-film production apparatus, temperature control using a heating medium is not conducted, and the temperature dependency of the light-induced-degradation rate of the film is strong, as shown in FIG. 4. As a result, if the temperature of the substrate 8 is increased in order to increase the deposition rate, the degree of temperature fluctuation increases, causing a deterioration in the stability of the film quality.

Figure 6:
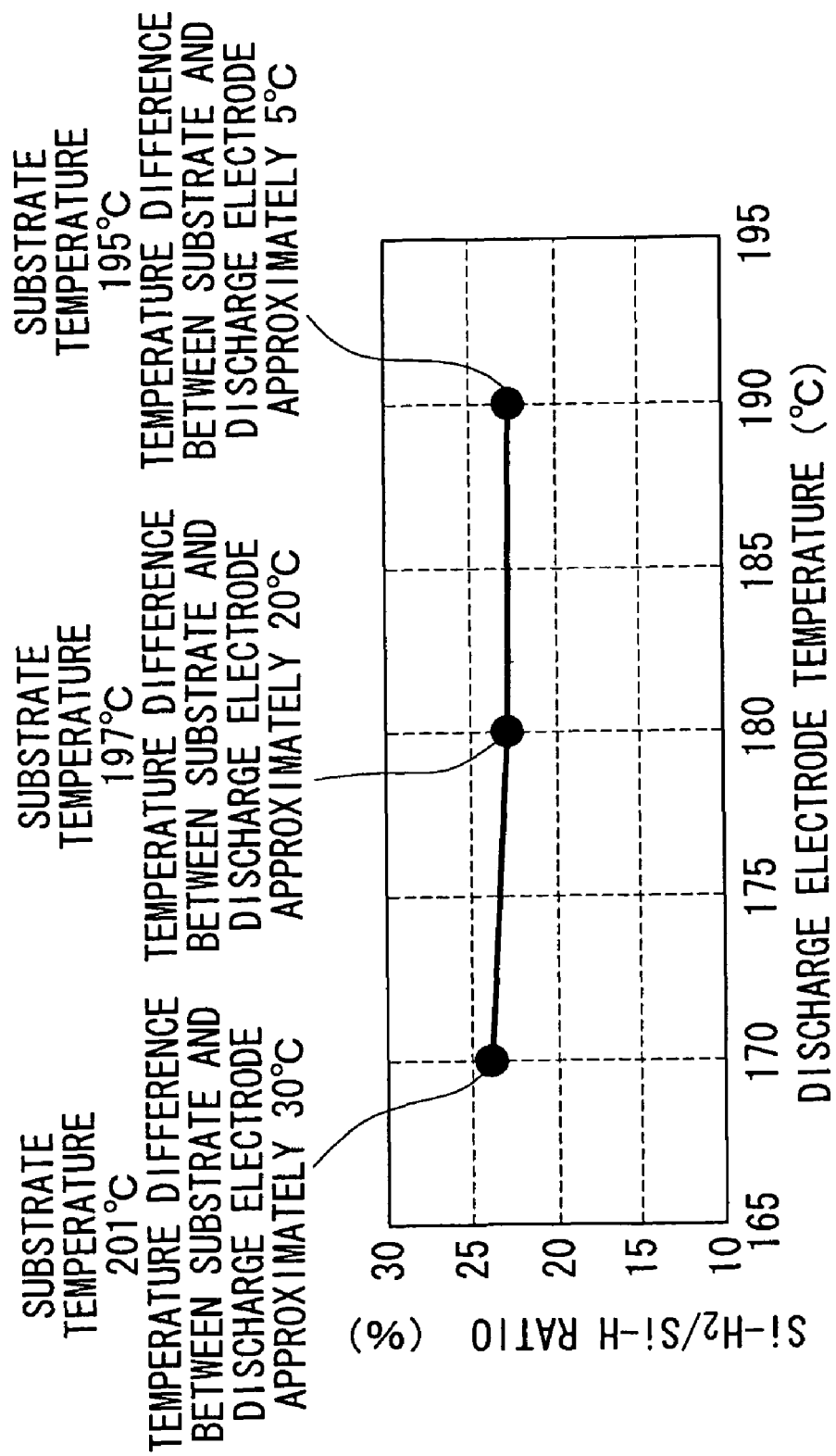
FIG. 6 A graph showing the relationship between the temperature difference between the substrate and the discharge electrode, and the $SiH_2/SiH$ ratio.

In this embodiment, by restricting the temperature difference between the substrate 8 and the discharge electrode 3 to not more than 30° C., substrate temperature dependency is less likely to appear, as shown in FIG. 6. As a result, the process window broadens, therefore selecting conditions that optimize the deposition conditions is easier, and the film quality also improves. In other words, in the conventional technology, when the temperature of the substrate 8 is maintained at a high level, the quantity of heat flowing in and out of the substrate 8 is large, resulting in a deterioration of the film quality due to temperature fluctuations, whereas in the embodiment of the present invention, the degree of robustness improves, and the stability of the production apparatus also improves. Furthermore, if the temperature difference between the substrate 8 and the discharge electrode 3 is approximately 20° C., then the degree of robustness can be further improved.

One reason for the improvement in film quality is thought to be due to the fact that the temperature difference between the substrate and the discharge electrode can be reduced by controlling the temperature of the discharge electrode, and the thermophoretic behavior of nanoclusters can be changed, thereby reducing the quantity of such nanoclusters incorporated into the film. Accordingly, under conditions where the substrate 8 and the discharge electrode 3 approach substantially the same temperature, meaning the temperature difference is small, an improvement in film quality is achieved.

Figure 5:
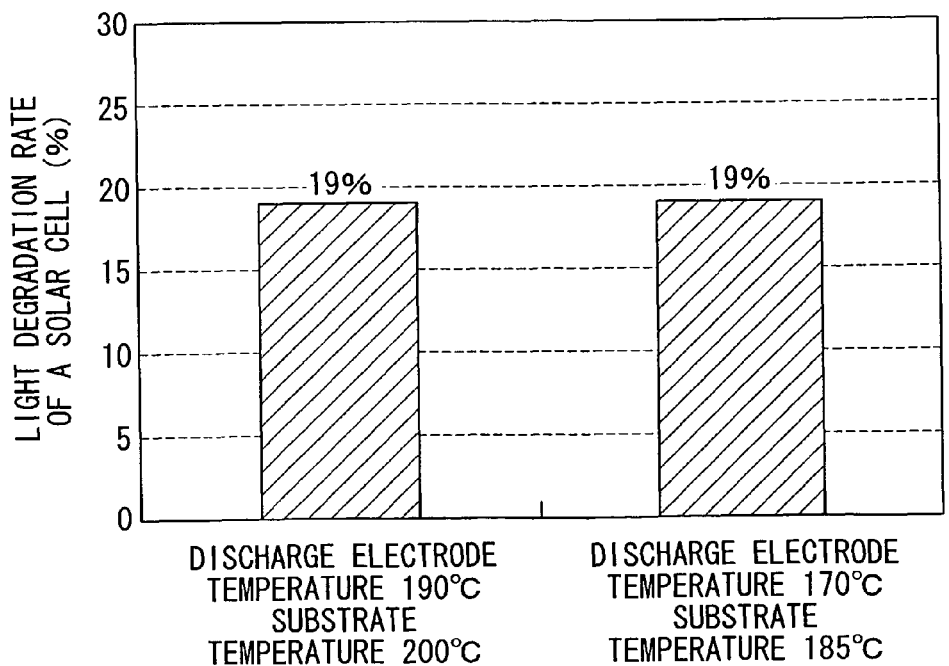
FIG. 5 A diagram showing that, for low-temperature deposition at a substrate temperature of not more than 200° C., when the temperature difference between the substrate and the discharge electrode is not more than 30° C., the film quality can be maintained, and the film degradation rate is independent of the temperature.
Figure 7:
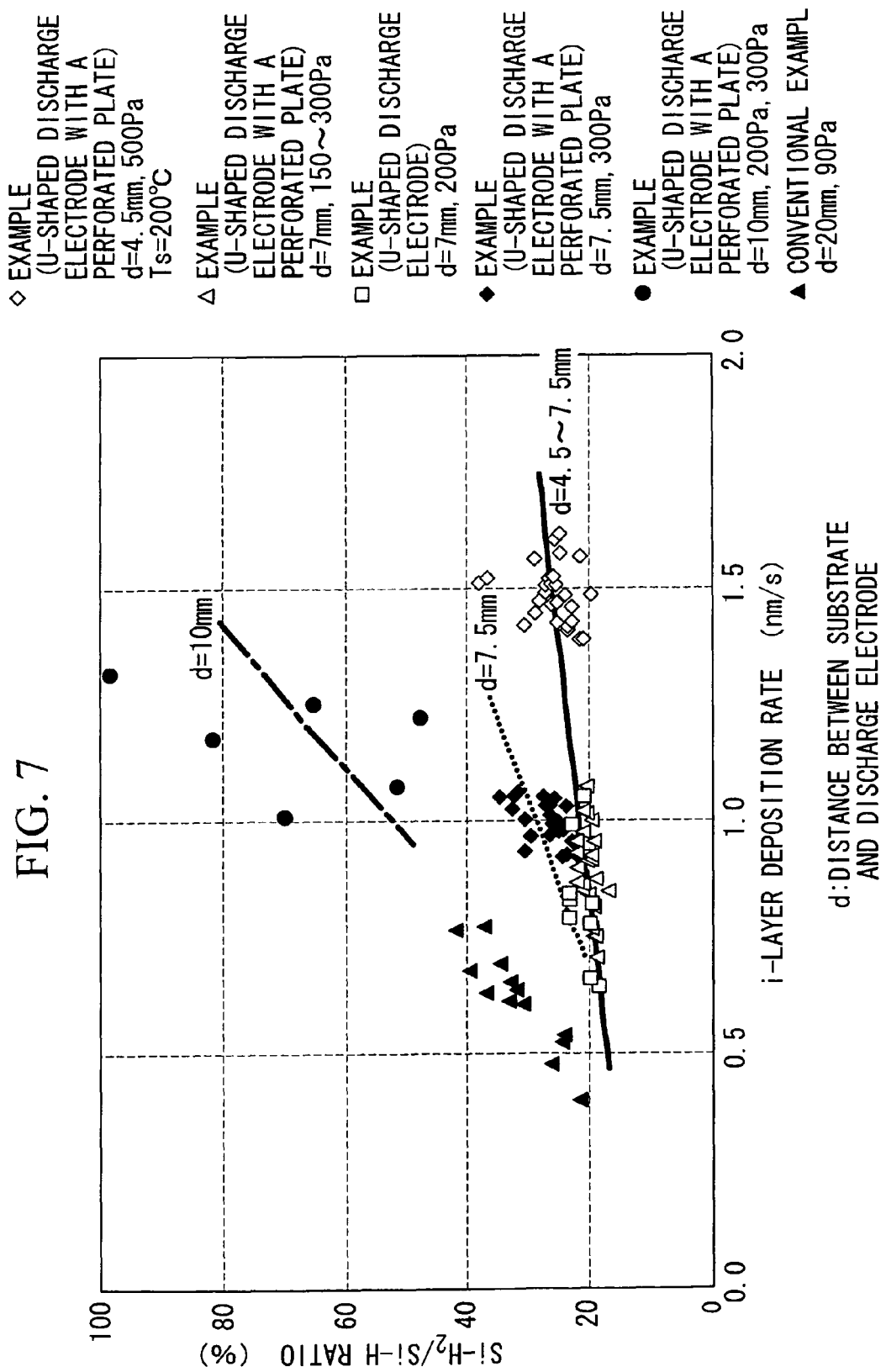
FIG. 7 A graph showing the relationship between the gap distance and the $SiH_2/SiH$ ratio under a variety of conditions.

By setting the distance between the discharge electrode 3 and the substrate 8 to a value not less than 4.5 mm and not more than 7.5 mm, the thermal conductivity between the substrate 8 and the discharge electrode 3 improves, ensuring that the temperature difference does not widen. As a result, during high-speed deposition, and even if the substrate temperature is set to a comparatively low temperature of 200° C. or lower, the $SiH_2/SiH$ ratio, which correlates with the level of light-induced-degradation, can be suppressed to a low level, as shown in FIG. 5, meaning the level of light-induced-degradation can be suppressed. This observation is thought to be due to the fact that the gas replacement rate near the surface of the substrate 8 can be improved by narrowing the gap, thereby reducing the quantity of clusters in the discharge region and reducing the incorporation of such clusters into the film. As shown in FIG. 7, the conventional tendency for the $SiH_2/SiH$ ratio to increase together with increases in the deposition rate is moderated, and it is evident that the $SiH_2/SiH$ ratio decreases as the gap distance is narrowed, and that favorable results can be obtained within the range from not less than 4.5 mm to not more than 10 mm, particularly at gap distances of not more than 7.5 mm. At gaps of 3 mm or less, because small deformations in the substrate or the discharge electrode can affect the properties of the deposited film, the process becomes impractical. Accordingly, with the present invention, high-speed deposition can be conducted with no deterioration in performance. Furthermore, because the deposition pressure is set to a high level of not less than 150 Pa and not more than 500 Pa, the deposition rate increases and ion bombardment of the substrate 8 can be suppressed, thereby light-induced-degradation during high-speed deposition can also be suppressed. Because the deposition is conducted with a narrow gap, the plasma distribution tends to deteriorate at the deposition pressure lower than 150 Pa, whereas the plasma is prone to localization at the pressure exceeding 500 Pa, which is undesirable.

Furthermore, mainly in the deposition of an i-layer of an amorphous silicon solar cell, because the substrate temperature can be reduced, the band gap of the i-layer can be held at an appropriate level. As a result, the open-circuit voltage can be increased, and the performance of the produced solar cell can be improved.

As described above, according to a thin-film production apparatus and a thin-film production method of the present embodiment, stable film quality can be achieved even at a comparatively low substrate temperature of approximately 200° C., and consequently the deposition rate can be increased. The light-induced-degradation rate for the solar cell can also be reduced. Moreover, because the i-layer is not deposited at high temperature, the open-circuit voltage can be increased, leading to an improvement in the solar cell performance.

In the embodiment described above, a single-layer amorphous silicon solar cell was described as the solar cell, but the present invention is not limited to this example. For example, the present invention can also be applied to other thin-film solar cells, including microcrystalline silicon solar cells, and multi-junction solar cells in which one or more amorphous silicon solar cell layers and microcrystalline solar cell layers are laminated together.

The invention claimed is:

1. A vacuum treatment method comprising the steps of:
   heating a substrate disposed inside a deposition chamber under a reduced pressure atmosphere using a heating device,
   supplying a raw material gas to the deposition chamber,
   supplying electric power to a discharge electrode disposed in a position facing the substrate, and
   plasma depositing a silicon-based film on the substrate, wherein
   the silicon-based film deposition is conducted with a gap between the substrate and the discharge electrode set to a value of not less than 4.5 mm and not more than 7.5 mm, in a state in which a temperature difference between the substrate and the discharge electrode is not more than 30 degrees C., so as to control an SiH.sub.2 to SiH ratio, and, wherein,
   the deposition is conducted with a deposition pressure inside the deposition chamber set to a value of not less than 150 Pa and not more than 500 Pa.

2. The vacuum treatment method according to claim 1, further comprising using a series of rods combined in a substantially parallel configuration, as the discharge electrode.

3. The vacuum treatment method according to claim 1, further comprising dividing the discharge electrode into a plurality of electrode units.

4. The vacuum treatment method according to claim 1, further comprising using temperature control to reduce a quantity of nanoclusterS incorporated into the silicon-based film during the depositing step.

5. The vacuum treatment method according to claim 1, further comprising disposing the deposition chamber on top of a base with an inclination θ, from the vertical wherein θ=7° to 12°.

6. The vacuum treatment method according to claim 1, wherein the step of heating the substrate comprises controlling a temperature of a heat spreader comprising the heating device, by circulating, within the heat spreader, a heating medium the temperature of which has been controlled, and therefore substantially unifying a temperature across the heat spreader.

7. The vacuum treatment method according to claim 1, wherein the step of heating the substrate comprises controlling a temperature of a heat spreader comprising the heating device, by incorporating a temperature-controlled heater within the heat spreader, and therefore substantially unifying a temperature across the heat spreader.

\* \* \* \* \*